United States Patent
Spinner, III

[11] Patent Number: 5,825,060
[45] Date of Patent: Oct. 20, 1998

[54] POLYCRYSTALLINE SILICON RESISTORS FOR INTERGRATED CIRCUITS

[75] Inventor: Charles R. Spinner, III, Dallas, Tex.

[73] Assignee: SGS-Thomson Microelectronics, Inc., Carrollton, Tex.

[21] Appl. No.: 869,517

[22] Filed: Apr. 16, 1992

Related U.S. Application Data

[62] Division of Ser. No. 531,012, May 31, 1990, Pat. No. 5,151,376.

[51] Int. Cl.[6] .......................... H01L 27/108; H01L 29/76
[52] U.S. Cl. .......................... 257/304; 257/296; 257/379; 365/51; 365/63
[58] Field of Search .................................. 357/59 F, 51; 257/296, 304, 379; 365/51, 63

[56] References Cited

U.S. PATENT DOCUMENTS

| | | | |
|---|---|---|---|
| 4,110,776 | 8/1978 | Rao et al. | 357/59 F |
| 4,774,203 | 9/1988 | Ikeda et al. | 357/59 F |
| 4,823,179 | 4/1989 | Koshimaru | 357/51 |
| 4,835,589 | 5/1989 | Pfiester | 357/51 |
| 5,012,443 | 4/1991 | Ema | 357/51 |

*Primary Examiner*—Mahshid D. Saadat
*Assistant Examiner*—Valencia Martin Wallace
*Attorney, Agent, or Firm*—Theodore E. Galanthay; Kenneth C. Hill; Lisa K. Jorgenson

[57] ABSTRACT

A resistor structure suitable for use in an SRAM cell is formed from polycrystalline silicon elements. These elements have a cross-section which is less than is normally available for polycrystalline silicon interconnect lines, allowing increased resistance values to be implemented using a lesser amount of surface area. In one embodiment of a resistor, sidewall spacers are formed in a cavity within an insulating layer, and polycrystalline silicon resistive elements are formed in the narrowed region within the cavity. In another embodiment, polycrystalline silicon resistors alongside vertical sidewalls of a cavity are formed using sidewall spacer technology. In either event, the cross-sectional area of the resistors is less than that normally available for a given processing technology, resulting in enhanced resistor values.

4 Claims, 3 Drawing Sheets

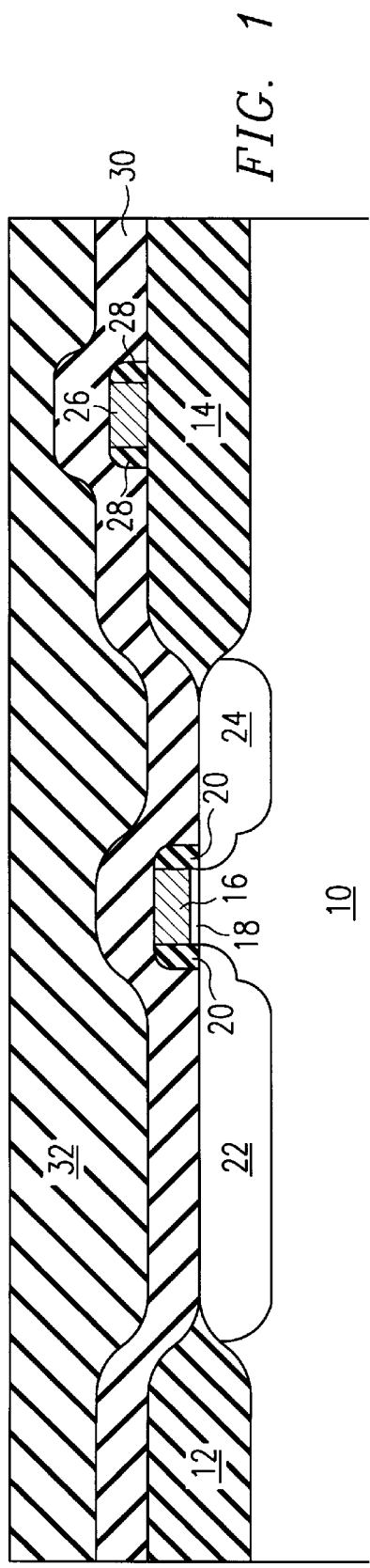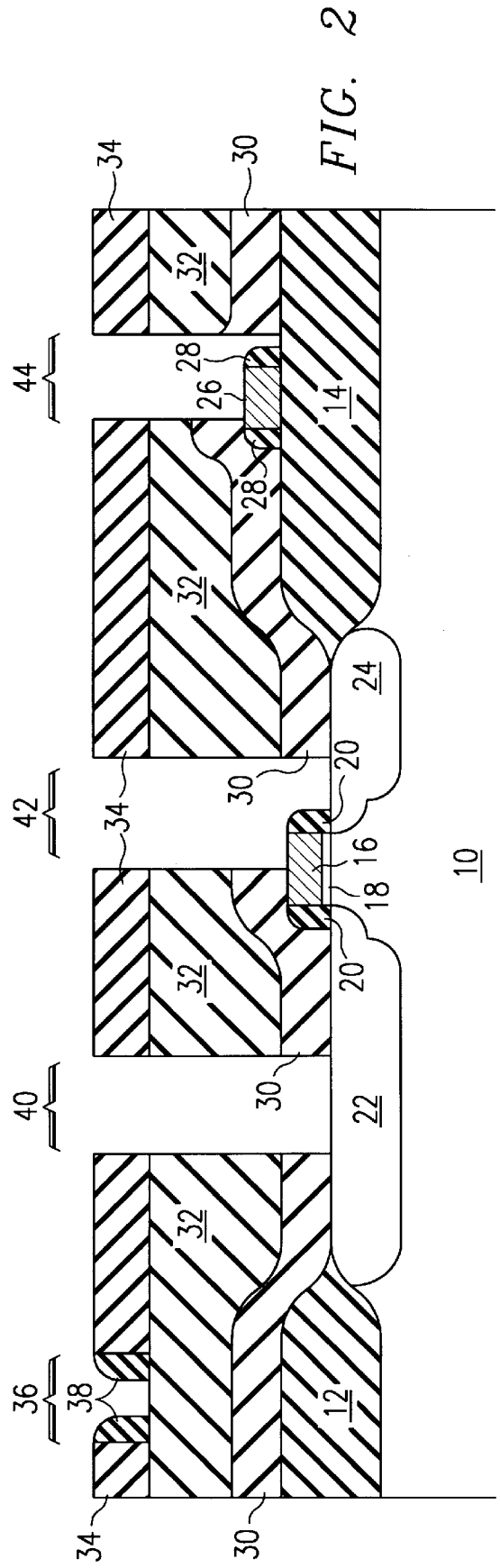

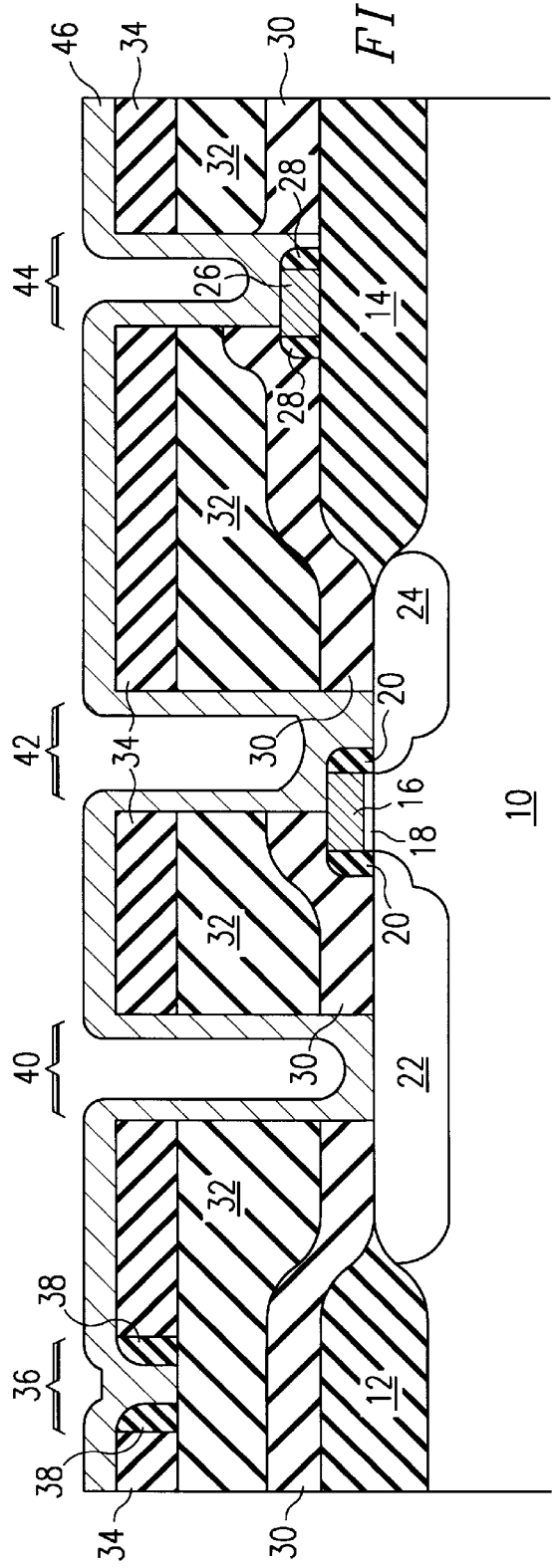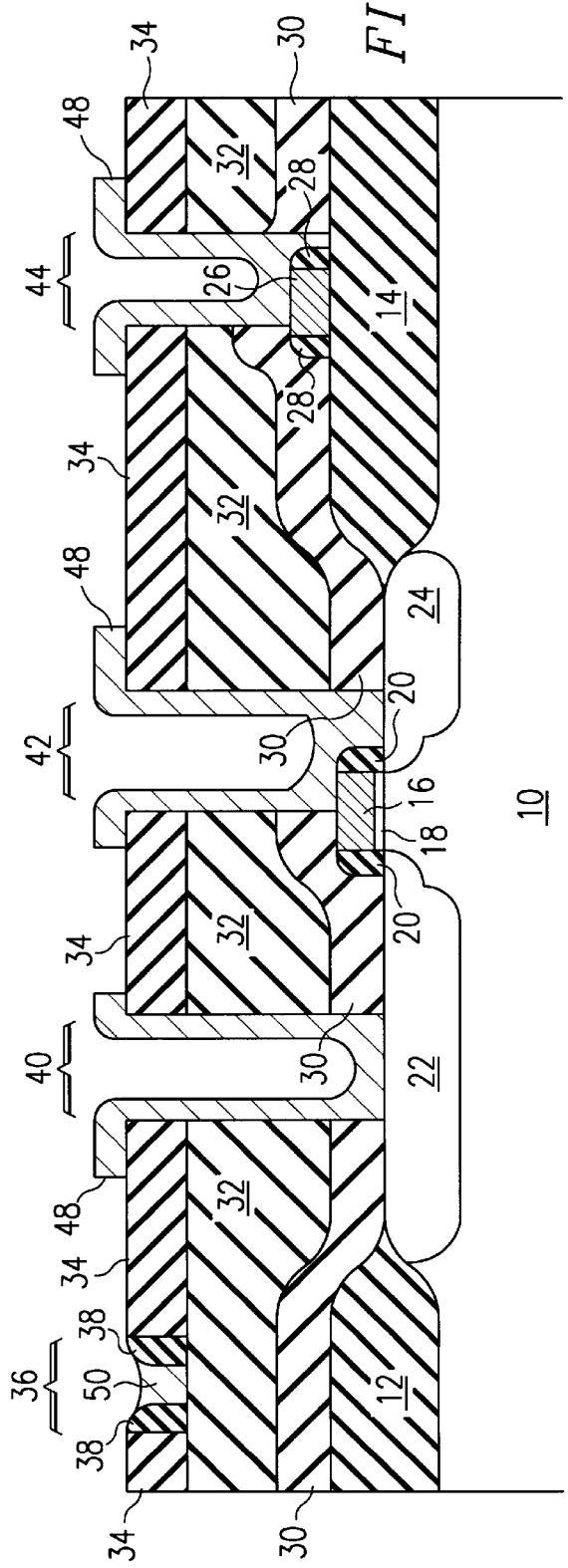

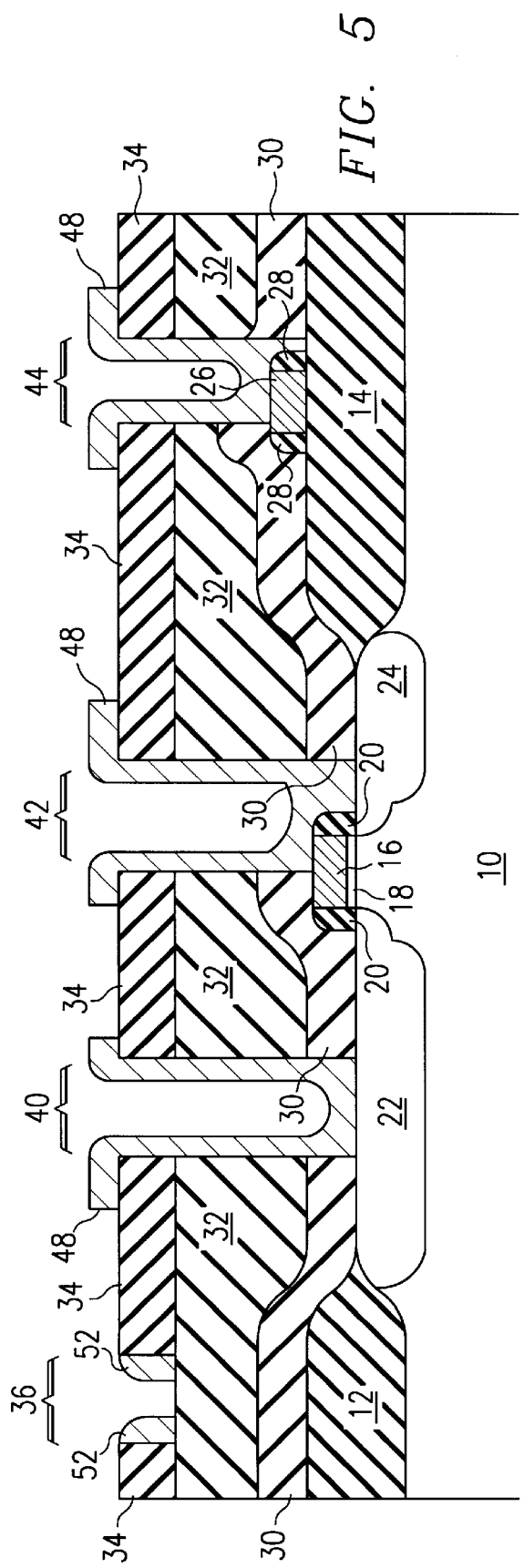
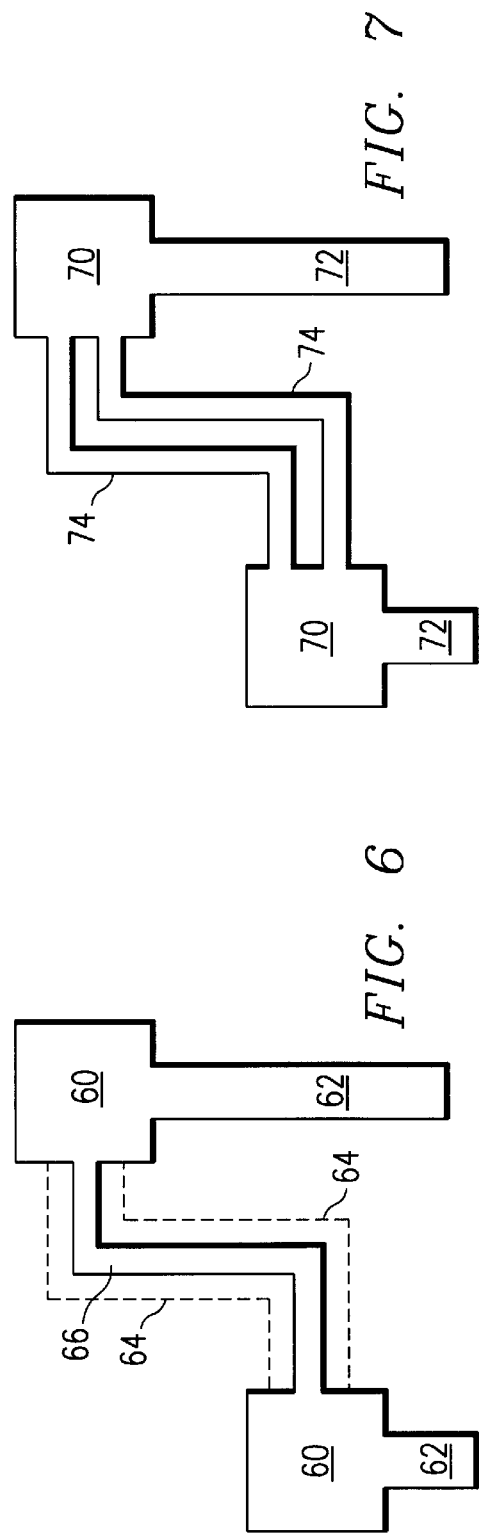

5,825,060

POLYCRYSTALLINE SILICON RESISTORS FOR INTERGRATED CIRCUITS

This is a Division of application Ser. No. 07/531,012, filed 31 May 1990 now U.S. Pat. No. 5,151,376.

BACKGROUND OF THE INVENTION

1. Field of the Invention

The present invention relates generally to integrated circuits, and more specifically to a method for fabricating polycrystalline silicon resistor structures therein.

2. Description of the Prior Art

CMOS SRAMs often use a four transistor cell design having resistive load devices. This design is used in order to save chip layout area over the traditional six transistor cell design. Two N-channel transistors are used to form a cross-coupled latch, while two additional N-channel transistors are used to provide access to the cell for reading and writing data. Two load devices are connected between the N-channel transistors in the latch and the power supply.

In the prior art, the resistive load devices are formed after formation of the transistors. After the transistors have been formed, a dielectric layer is deposited and contact openings are formed to the substrate. A second polycrystalline silicon layer is deposited and lightly doped N-type to achieve a resistivity in the range of $10^6$ to $10^{13}$ ohms/square. This blanket implant determines the load resistor value. The resistivity of the load resistors must below enough to supply ample current to compensate for transistor leakages, but high enough to allow for sufficient standby currents for proper device operation under adverse conditions.

Resistance of the polycrystalline silicon load structures is a function of four variables. These are: the grain structure of the polycrystalline silicon used to form the resistor structure, the impurity levels used to dope the polycrystalline silicon; the cross-sectional area of the resistive device; and the length of the device. Impurity levels and polycrystalline silicon grain structure can be controlled only to limits determined by the process technology being used. If cross-sectional area of the structure could be reduced, length of the load resistor could also be reduced to preserve a given resistance for a small overall structure.

It would be desirable to provide a polycrystalline silicon resistor structure, and a method for fabricating same, which resulted in resistor structures having a reduced cross-sectional area. It would further be desirable for such a method to be compatible with existing process technologies.

SUMMARY OF THE INVENTION

It is therefore an object of the present invention to provide a polycrystalline silicon resistor structure, and method for making same, having a reduced cross-sectional area.

It is a further object of the present invention to provide such a structure and method which is compatible with current process technologies.

It is another object of the present invention to provide such a structure and method which adds a minimal amount of complexity to the process flow used to fabricate the device.

Therefore, according to the present invention, a method for fabricating polycrystalline silicon resistor structures includes steps directed to the provision of a polycrystalline silicon structure having a decreased width. In one embodiment, sidewall spacers are used to narrow a region in which the polycrystalline silicon resistors are formed. In an alternative embodiment, polycrystalline silicon resistors are formed as sidewall structures in a resistor region. Use of either technique provides a reduced cross-section for the resistor structures, allowing shorter resistors to be used, or providing increased resistance for longer resistors.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 1–4 illustrate the formation of polycrystalline silicon resistor structures according to a first preferred embodiment of the present invention;

FIG. 5 illustrates the formation of polycrystalline silicon resistor structures according to a second preferred embodiment;

FIG. 6 is a planned view of a resistor formed according to the technique described in connection with FIGS. 1–4; and FIG. 7 illustrates resistive structures formed according to the technique described in connection with FIG. 5.

DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Referring to FIG. 1, integrated circuit devices are formed in a substrate 10. Field oxide regions 12, 14 separate and define active areas within the substrate 10. Polycrystalline silicon signal line 16 is used to conduct signals on the device. Signal line 16 is separated from the substrate 10 by gate oxide layer 18. Sidewall oxide spacers 20 are formed on either side of the signal line 16 as known in the art.

Although the cross-sectional view through signal line 16 shows the same structure as a field effect transistor, signal line 16 can be a non-gate signal line which is utilized in a shared contact region. Signal line 16 will be so used as will be described further below. Active regions 22, 24 function as the source/drain regions of the field effect device if polycrystalline silicon signal line 16 actually functions as a field effect gate. In a shared contact layout, the active areas 22, 24 may actually be connected out of the plane of the drawing, so that the signal line 16 does not function as a gate.

Polycrystalline silicon signal line 26 rests on field oxide region 14. Oxide sidewall spacers 28 are formed thereon at the same time as sidewall spacers 20.

Processing to form the elements just described is conventional as known in the art. After formation of the transistor structures, dielectric layer 30 is deposited over the surface of the integrated circuit device. This layer 30 is preferably LPCVD/APCVD/LTO silicon dioxide followed by a deposited layer of LPCVD silicon nitride as known in the art. Other insulating layers may be used if desired.

After formation of dielectric layer 30, insulating layer 32 is deposited over the surface of the device. Layer 32 is preferably a dielectric which can be easily planarized. Layer 32 may be, for example, BPSG which is deposited and heated to reflow as known in the art. If BPSG is used, the reflow is preferably performed in an ambient atmosphere including steam. The reflow cycle, or other planarization step, results in a nearly planar surface as shown in FIG. 1.

Referring to FIG. 2, an insulating layer 34 is deposited over the surface of the device. Insulating layer 34 is preferably an LPCVD silicon nitride layer deposited to a depth of approximately 2000–4000 angstroms. Nitride layer 34 is then patterned and etched to define a region 36 in which polycrystalline silicon resistors are to be formed.

Another insulating layer (not shown) is deposited over the surface of the chip, and anisotropically etched without masking to form sidewall spacers 38 within the resistor region 36. The insulating layer used to form the spacers 38 is preferably an LPCVD/LTO silicon oxide layer. The oxide layer is deposited to a thickness which results in the width of the oxide regions 38 resulting as desired. As known in the art, the width of the spacers 38 is approximately equal to the thickness of the oxide layer from which they are formed. Thus, for example, if a 0.2 micron opening is desired between the spacers 38, and the region 36 is one micron wide, the oxide layer used to produce spacers 38 is deposited to a depth of approximately 4000 angstroms.

After formation of the sidewall spacers 38, contacts are opened to the substrate 10 and other underlying features through insulating layers 30, 32, 34. As examples of the types of contacts which may be formed, contact opening 40 makes contact with active region 22 within a substrate 10. Contact opening 42 makes contact with both the polycrystalline silicon signal line 16 and active region 24. The contact to be formed in opening 42 is part of a shared contact region. Contact opening 44 is opened simply to allow contact to underlying polycrystalline silicon line 26.

Referring to FIG. 3, a layer of polycrystalline silicon 40 is deposited over the device. Layer 40 is preferably deposited to a depth of approximately 500 to 1500 angstroms. A blanket impurity implant is then made to control the resistivity of the polycrystalline silicon resistors to be fabricated in region 36. If N-type resistors are to be formed, an N- implant is made.

Referring to FIG. 4, the polycrystalline silicon layer 46 is patterned and etched to remove it except in the desired contact regions 40, 42, 44 and interconnect regions as desired. This results in various polycrystalline silicon contact structures 48 as shown. The layer 40 is etched to completely clear it, which can be accomplished by etching until the end point is reached as known in the art, and continuing the etch for a period of time approximately ten percent beyond reaching the end point. Such an over etch insures that undesired polycrystalline silicon regions do not remain behind.

During etching of the polycrystalline silicon layer 46, resistor region 36 is left unmasked. This causes the polycrystalline silicon overlying such region 36 to be etched away. However, due to the depth of the region 36, some material remains in the region between the sidewall spacers 38. This polycrystalline silicon region 50 provides the resistor desired for use in the device. As will be apparent to those skilled in the art, the cross-sectional area of resistor 50 is much smaller than a resistor which fills the resistor region 36.

A masked $N^+$ implant can then be made to reduce the resistivity of the polycrystalline silicon contacts and interconnect 48. Remaining fabrication steps for the device, such as formation of further polycrystalline silicon and metal interconnect layers, is completed in a conventional manner. To a great extent, the device is already planarized due to the planarization of insulating layer 32, so that further planarization steps may be minimized or not required.

Referring to FIG. 5, an alternative technique for fabricating small cross-section polycrystalline silicon resistor structures is shown. The technique used is very similar to that described in connection with FIGS. 1–4. The difference is that the deposition of the oxide layer, and anisotropic etching thereof to form sidewall spacers 38, is not performed. Instead, when polycrystalline silicon layer 40 is deposited over the device, it extends across the entire width of resistor region 36. When the polycrystalline silicon is anisotropically etched to form contact and interconnect regions 48, sidewall polycrystalline silicon regions 52 are formed within the resistor region 36. These regions 52 are separated by region 54 in much the same manner that sidewall oxide regions 38 were separated as described in connection with FIG. 2. The width of the polycrystalline silicon resistors 52 is controlled by the depth to which polycrystalline silicon layer 46 is deposited. The height of the resistor regions 52 is controlled by the depth to which the nitride layer 34 is deposited. Decreasing the depth of nitride layer 34, or the thickness of polycrystalline silicon layer 46, results in resistor regions 52 having a smaller cross-sectional area.

Further processing of the device after the stage shown in FIG. 5 is completed in a conventional manner as described above in connection with FIG. 4.

FIG. 6 illustrates a plan view of a polycrystalline silicon resistor formed according to the techniques described in connection with FIGS. 1–4. Polycrystalline silicon contacts 60 connect to signal lines 62. Lines 64 indicate the boundaries of the resistor region 36. Polycrystalline silicon resistor 66 connects the contacts 60.

As can be seen, the cross-sectional area of the polycrystalline silicon resistor 66 is greatly reduced from that which would normally be formed connecting contact regions 60. This allows a much higher valued resistor to be formed, or a shorter resistor to be used. Use of shorter resistor 66 allows the contacts 60 to be placed closer together, if desired, thereby reducing the overall layout area required for circuit structures such as 4-transistor SRAM cells.

FIG. 7 is a plan view of a device constructed according to the method described in connection with FIG. 5. Contact regions 70 are connected to signal lines 72. Polycrystalline silicon resistors 74 connect the contact regions 70. Since the resistors are formed on both sidewalls of the resistor region 36, two parallel resistors 74 are formed. The twin resistor structures 74 shown in FIG. 7 have the same advantages as the single structure 66 shown in FIG. 6, and can be fabricated with a lesser number of process steps.

The resistor structures described above provide polycrystalline silicon resistor structures which have a reduced width, and thus a reduced cross-sectional area. Use of such resistor structures in circuits such as CMOS SRAM cells allows the use of shorter resistors for a given required resistance. This can lead to smaller cell layout areas, and increased device density on an integrated circuit chip.

While the invention has been particularly shown and described with reference to a preferred embodiment, it will be understood by those skilled in the art that various changes in form and detail may be made therein without departing from the spirit and scope of the invention.

What is claimed is:

1. An integrated circuit device resistor structure, comprising:

an insulating layer having an elongate etched out region connecting a first conductive region with a second conductive region, said elongate region having substantially vertical side walls;

insulating side wall regions along the side walls of the elongate region, said insulating side wall regions defining an elongate narrowed region therebetween connecting the conductive regions; and a polycrystalline silicon region located in the narrowed region, wherein said polycrystalline silicon region forms a resistor connecting the conductive regions.

2. The structure of claim 1, wherein the resistor comprises a load structure for an SRAM cell.

3. The resistor structure of claim 1, wherein said polycrystalline silicon region has a cross section characteristic of being formed from the steps of:

forming a layer of polycrystalline silicon over said insulating layer and said insulating side wall regions, and in the narrowed region; and anisotropically etching back the polycrystalline silicon layer to leave said polycrystalline silicon region in the narrowed region.

4. The resistor structure of claim 3, wherein said polycrystalline silicon region has an upper surface below an upper surface of said insulating layer.

* * * * *